United States Patent
Brauns et al.

(10) Patent No.: US 6,816,099 B2
(45) Date of Patent: Nov. 9, 2004

(54) CURRENT-MODE D/A CONVERTER HAVING VARIABLE OUTPUT AND OFFSET CONTROL

(75) Inventors: Gregory T. Brauns, Raleigh, NC (US); Russell C. Deans, Durham, NC (US); D. Lee Newman, Jr., Raleigh, NC (US); Brian Worobey, Durham, NC (US)

(73) Assignee: Renesas Technology America, Inc., San Jose, CA (US)

( * ) Notice: Subject to any disclaimer, the term of this patent is extended or adjusted under 35 U.S.C. 154(b) by 0 days.

(21) Appl. No.: 10/395,005

(22) Filed: Mar. 21, 2003

(65) Prior Publication Data

US 2004/0183706 A1 Sep. 23, 2004

(51) Int. Cl.[7] .................................................. H03M 1/80
(52) U.S. Cl. ...................................... 341/153; 341/120
(58) Field of Search ................................. 341/135, 144, 341/120, 118, 145; 360/78.04; 702/120

(56) References Cited

U.S. PATENT DOCUMENTS

| | | | |
|---|---|---|---|
| 4,138,671 A | | 2/1979 | Comer et al. |
| 5,185,734 A | | 2/1993 | Call et al. |
| 5,493,519 A | * | 2/1996 | Allen, III .................... 702/120 |
| 5,635,935 A | * | 6/1997 | Ignowski et al. ............ 341/135 |
| 5,689,259 A | * | 11/1997 | Ozguc .......................... 341/144 |
| 5,717,321 A | | 2/1998 | Kerth et al. |
| 5,790,331 A | | 8/1998 | Aranovsky |
| 6,002,237 A | | 12/1999 | Gaza |
| 6,151,186 A | * | 11/2000 | O'Farrell .................. 360/78.04 |
| 6,329,804 B1 | | 12/2001 | Mercer |
| 6,674,377 B1 | * | 1/2004 | Li ................................ 341/120 |

* cited by examiner

Primary Examiner—Jean Bruner Jeanglaude
(74) Attorney, Agent, or Firm—Burns, Doane, Swecker & Mathis, L.L.P.

(57) ABSTRACT

A current-mode D/A converter is described having variable output and offset control. According to an exemplary embodiment, a first D/A converter includes a number of first control inputs and an output capable of generating a first current proportional to a number of active first control inputs. A driver includes an input connected to the output of the first D/A converter, a number of second control inputs, and an output capable of generating a second current proportional to the first current based on a number of active second control inputs. A second D/A converter includes a number of third control inputs and an output capable of generating a third current proportional to a number of active third control inputs. Offset control circuitry includes an input connected to the output of the second D/A converter, an offset control input, and an output connected to the output of the driver. The offset control circuitry is capable of summing the second and third currents at the output of the driver when the control input is active.

15 Claims, 5 Drawing Sheets

US 6,816,099 B2

CURRENT-MODE D/A CONVERTER HAVING VARIABLE OUTPUT AND OFFSET CONTROL

BACKGROUND

Current output (or current-mode) digital-to-analog (D/A) converters sum together currents based on a set of digital input values to create an analog output current representative of the digital input values. Such D/A converters (DACs) typically sum a number of weighted values of a base (or reference) current to create the analog output current. The number of weighted values is dependent of the desired resolution (or number of bits) of the DAC. The weights can set such that the currents being summed are equal, or have a particular relationship, such as linear, binary, or logarithmic relationship. A particular DAC design has a fixed maximum current output value and a fixed output range of current values determined by the reference current, the weighting, if any, and the resolution of the DAC design.

Use of a particular DAC design in a variety of different applications or with a number of varying load devices can lead to inefficient usage of the DAC for some of the applications or loads. For example, in an application where the desired range of an input signal is only a portion of the full range of the DAC output, only a portion of the DACs input range will be used. The portion of the DACs input range used must still satisfy the input resolution requirements of the application, which can lead to a sub-optimum design point for applications that require the full output range (and consequently the full input range) of the DAC.

Moreover, varying applications (and loads) can require varying output ranges centered at different nominal current values. With a fixed DAC design, it is necessary for these varying applications (and loads) to use different portions of the input range of the DAC to achieve the desired output range. This can lead to having to over-design the input/output range of the DAC to accommodate for the varying ranges required by applications or load environments in which the DAC will be used.

SUMMARY

Accordingly, a current-mode D/A converter is described having variable output and offset control. According to an exemplary embodiment, a current-mode D/A converter having variable output control includes a D/A converter having a number of first control inputs and an output capable of generating a first current proportional to a number of active first control inputs. A driver is included having an input connected to the output of the D/A converter, a number of second control inputs, and an output capable of generating a second current proportional to the first current based on a number of active second control inputs.

According to another exemplary embodiment, a current-mode D/A converter is described having variable output and offset control includes a first D/A converter having a number of first control inputs and an output capable of generating a first current proportional to a number of active first control inputs. A driver includes an input connected to the output of the first D/A converter, a number of second control inputs, and an output capable of generating a second current proportional to the first current based on a number of active second control inputs. A second D/A converter includes a number of third control inputs and an output capable of generating a third current proportional to a number of active third control inputs. Offset control circuitry includes an input connected to the output of the second D/A converter, an offset control input, and an output connected to the output of the driver. The offset control circuitry is capable of summing the second and third currents at the output of the driver when the control input is active.

According to another exemplary embodiment, a method is described for converting a digital input to a current having variable output and offset values including generating a first current proportional to a number of active first control inputs, the first current having a fixed maximum output value and a fixed offset value. A second current is generated having a variable maximum output value proportional to the first current based on a number of active second control inputs. A third current is generated that is proportional to a number of active third control inputs, the third current having a fixed maximum output value. The first and third currents are added together when an offset control input is active to form an output current proportional to a number of active first control inputs and having variable output and offset values based on the active second and third control inputs, respectively.

BRIEF DESCRIPTION OF THE DRAWINGS

The accompanying drawings provide visual representations which will be used to more fully describe the representative embodiments disclosed herein and can be used by those skilled in the art to better understand them and their inherent advantages. In these drawings, like reference numerals identify corresponding elements, and.

DETAILED DESCRIPTION

Figure 1:
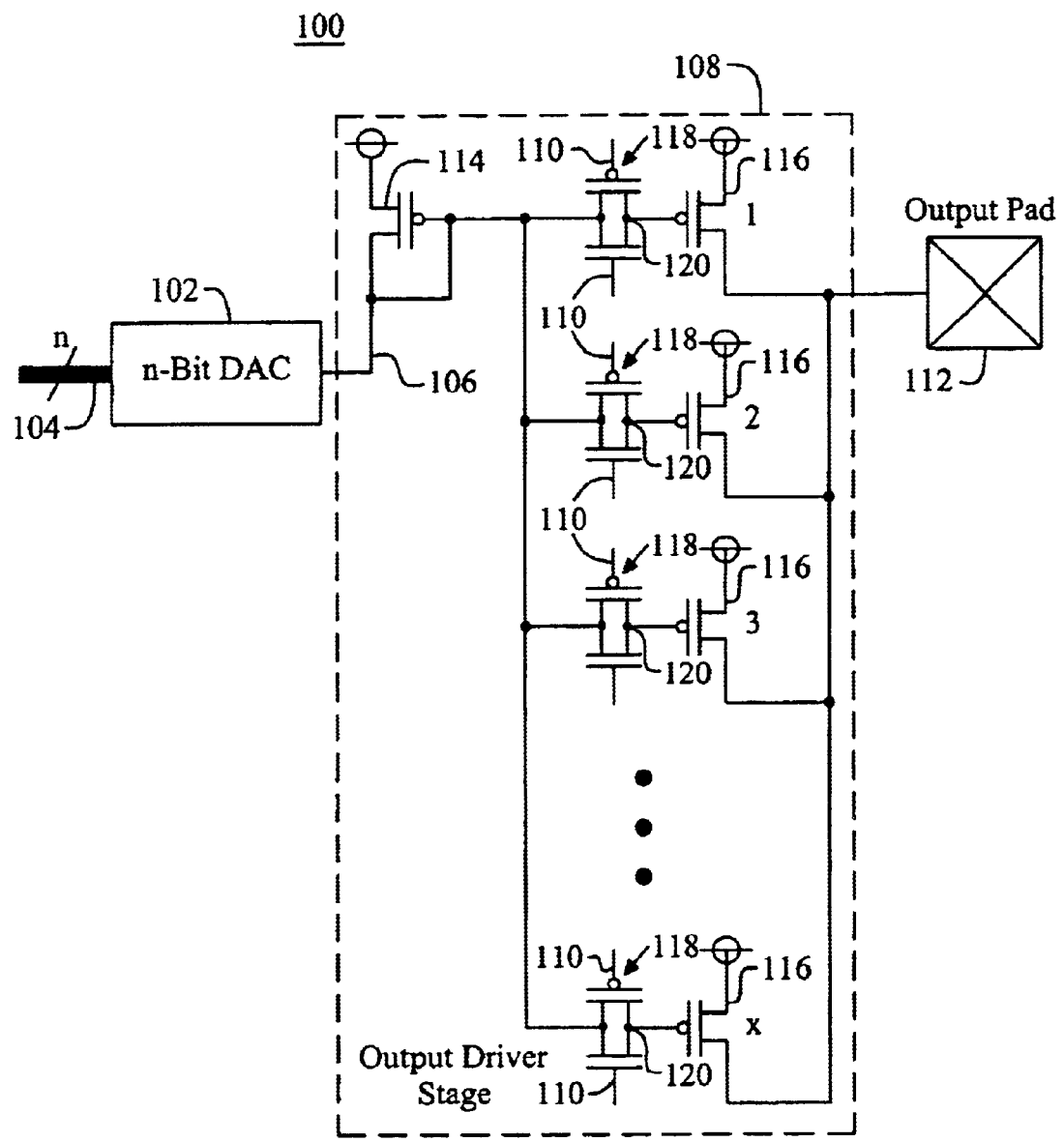
FIG. 1 illustrates a current-mode D/A converter having variable output control according to an exemplary embodiment.

FIG. 1 depicts a current-mode D/A converter 100 having variable output control according to an exemplary embodiment. The exemplary converter 100 includes a D/A converter (DAC) 102 having a number of first control inputs 104 and an output 106 capable of generating a first current proportional to a number of active first control inputs 104. The control inputs can be digital inputs having an active state (e.g., a logic "1") and an off state (e.g., a logic "0"). The active and off states can be represented by corresponding voltages, e.g., +3.3 V and 0 V. Together, the control inputs can form a digital word. A typical n-bit current-mode DAC has $2^n$ current output steps ranging from a minimum value to some maximum value MAX amps.

The converter 100 further includes a driver 108, identified in the figure using a dashed line. The driver 108 includes an input 106 connected to the output 106 of the DAC 102, a number of second control inputs 110. Again, the control inputs can be digital inputs having an active state (e.g., a logic "1") and an off state (e.g., a logic "0"). The active and off states can again be represented by corresponding voltages, e.g., +3.3 V and 0 V. The driver 108 further includes an output 112 capable of generating a second current proportional to the first current based on a number of active second control inputs 110.

According to an exemplary embodiment; the driver 108 can include a current-mirror device 114 having a first terminal 106 corresponding to the input of driver. The driver 108 can also include a number of output devices 116 in correspondence to the number of second control inputs 110 (e.g., "X" in the figure). Each of the X output devices 116 includes an output terminal 112 connected to the output of the driver. The driver 108 further includes a selector having an input terminal 106 connected to a second terminal of the current-mirror device 114. According to the exemplary embodiment, the first and second terminals 106 of the current-mirror device 114 are connected together to form a diode connection, but other circuit arrangements capable of mirroring the first current output from the DAC 102 are within the scope of what is described.

The selector includes a number of pass-gates 118 in correspondence to the number of second control inputs 110. The selector also includes a number of control terminals 110 each connected to a respective second control input 110, and a number of output terminals 120 each connected to an input terminal 120 of a respective output device 116.

According to another embodiment, the second current can be linearly proportional to the first current. With such an arrangement, a current-producing capacity of each of the output devices 116 is substantially equal, and in total, can be substantially equal to a current-producing capacity of the current-mirror device 114. For the exemplary metal-oxide-semiconductor (MOS) devices shown in FIG. 1, the current-producing capacity of the devices is proportional to the width (W) of the gate contact of the devices divided by the length (L) of the gate contact. Thus, according to this embodiment, the W/L ratio of each of the output devices 116 can be substantially equal to one another, and the sum of the W/L ratio of the output devices in total can equal the W/L ratio of the current-mirror device 114.

The second current can also be proportional to the first current based on a binary value associated with each of the active second control inputs. With this type of arrangement, a current-producing capacity of each of the output devices 116 can be proportional to a binary value associated with a respective second control input 110, and in total, can be substantially equal to a current-producing capacity of the current-mirror device 114. With either of the above arrangements, those skilled in the art will understand that the output devices 116 can be embodied in a single output device, having multiple outputs (or "fingers") each having appropriately sized current-producing capacities (e.g., W/L ratios).

As described above, the DAC 102 shown in FIG. 1 has both a fixed maximum output value and a fixed output range. The driver 108, having the digitally controllable inputs 10, enables the maximum output value (and consequently the range) of the DAC 102 to be dynamically adjusted without reducing the DAC's resolution. For example, given an n-bit current-mode DAC 102 with a maximum output of MAX, amps, the output current of the DAC 102 (i.e., the first current) can be expressed as:

$$(IN_n/2^n)*MAX_n,$$

where: $IN_n$ is in the set of integers ranging from 1 to $2^n$. Given a driver 108 having X equal-sized output devices 116, the output current of the driver 108 (i.e., the second current) can be expressed as:

$$(IN_n/2^n)*(IN_x/X)MAX_n,$$

where:
$IN_x$ is in the set of integers ranging from 1 to X; and
$IN_n$ is in the set of integers ranging from 1 to $2^n$.

Figure 2:
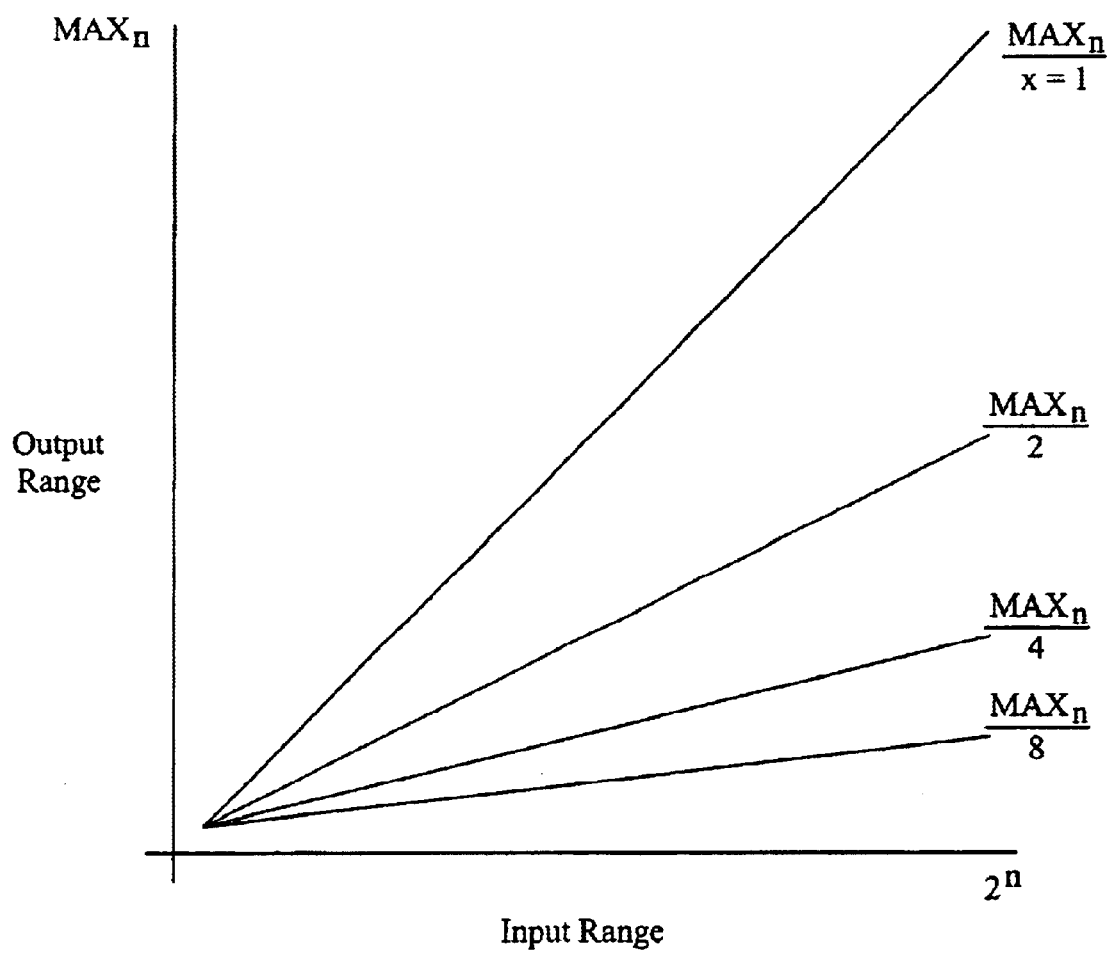
FIG. 2 illustrates various transfer functions of the D/A converter shown in FIG. 1.

FIG. 2 illustrates the transfer characteristics of the converter 100 shown in FIG. 1, having X equal-sized output devices 116 in the driver 108. The transfer characteristics show the output current of the driver 108 (i.e., the second current) as the first control inputs 104 to the DAC 102 are varied from 1 to $2^n$ and as the second control inputs 110 to the driver 108 are varied from 1 to X=8. As described above, the output devices 116 of the driver 108 can sized so as to create different weighted current-producing capacities in the devices, e.g., similar to the binary weighting used in conjunction with Binary DACs. Also, the output devices 116 can be combined into a single device having multiple current outputs (or fingers).

Figure 3:
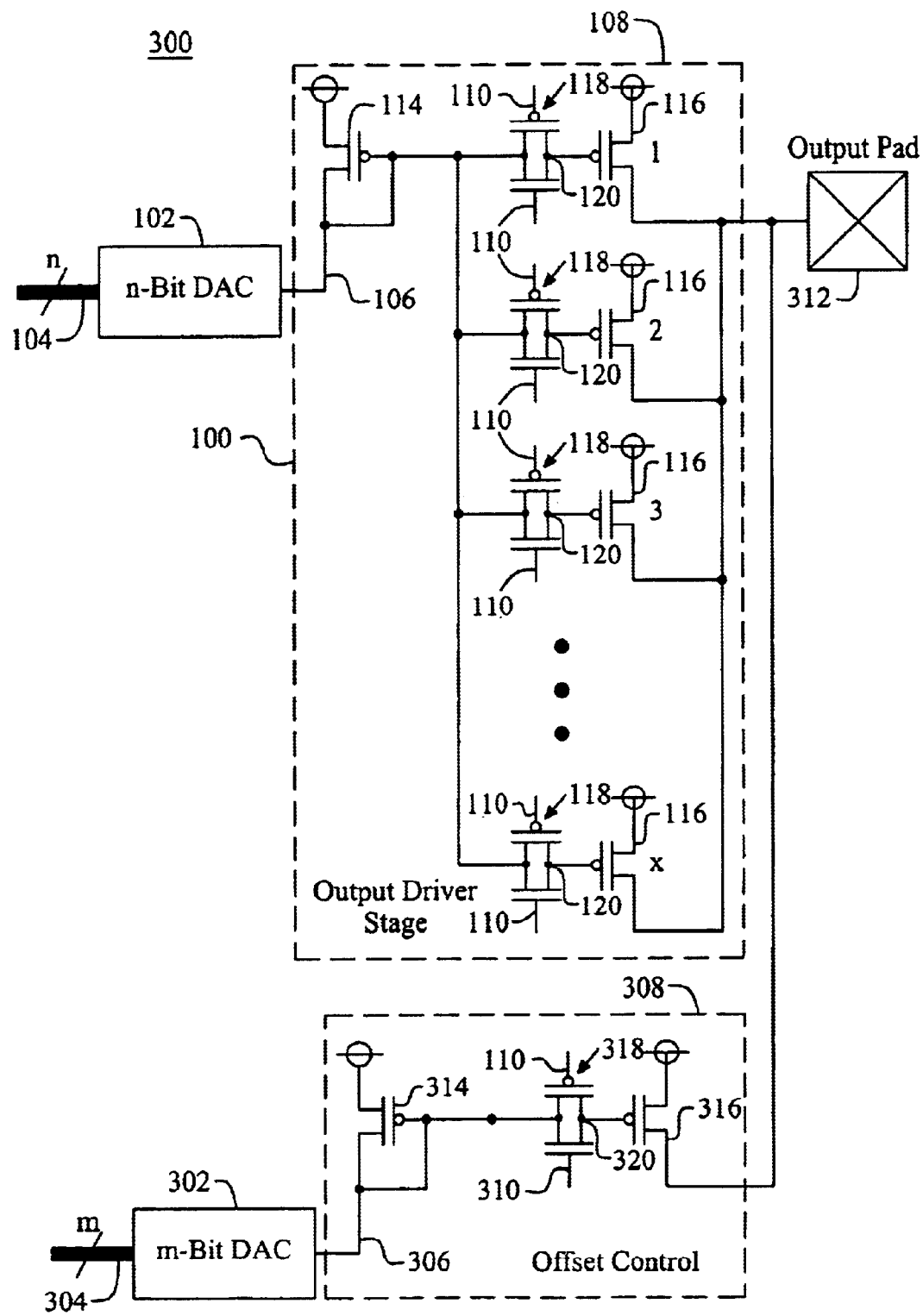
FIG. 3 illustrates a current-mode D/A converter having variable output and offset control according to an exemplary embodiment.

FIG. 3 illustrates an current-mode D/A converter having variable output and offset control according to an exemplary embodiment. The converter 300 includes a first current-mode D/A converter 100 having variable output control, substantially as described in conjunction with the exemplary embodiment shown in FIG. 1. The converter 300 further includes a second D/A converter 302 having a number of third control inputs 304 and an output 306 capable of generating a third current proportional to a number of active third control inputs 304. The converter also includes offset control circuitry 308 having an input 306 connected to the output of the second D/A converter 302, an offset control input 310, and an output 312 connected to the output of the driver 108.

According to an exemplary embodiment, the offset control circuitry can include a current-mirror device 314 having a first terminal 306 corresponding to the input of the offset control circuitry 308. An output device 316 can be included having an output terminal 312 corresponding to the output of the offset control circuitry 308. A control device 318 can be included having an input terminal 306 connected to a second terminal of the current-mirror device 314 of the offset control circuitry 308. According to the exemplary embodiment, the first and second terminals 306 of the current-mirror device 314 are connected together to form a diode connection, but other circuit arrangements capable of mirroring the third current output from the DAC 302 are within the scope of what is described. The control device 318 can also include a control terminal connected to the offset control input 310, and an output terminal 320 connected to an input terminal of the output device 316 of the offset control circuitry 308.

According to exemplary embodiments, a current-producing capacity of the output device 316 of the offset control circuitry 308 is substantially equal to a current-producing capacity of the current-mirror device 314 of the offset control circuitry 318. As such, any current produced at the output pad 312 by the output device 316 will substantially equal the third current produced by the second DAC 302, as the current-mirror device 314 and output device 316 function as a current mirror. Accordingly, when the offset control input 310 is active the third current will be summed with the second current produced by the driver 108 and present at the output pad 312, effectively adding an offset current to the second based on the number of third control inputs that are active. In the exemplary embodiment shown, no offset current will be added to the second current when the offset control input 310 is not active.

Figure 4:
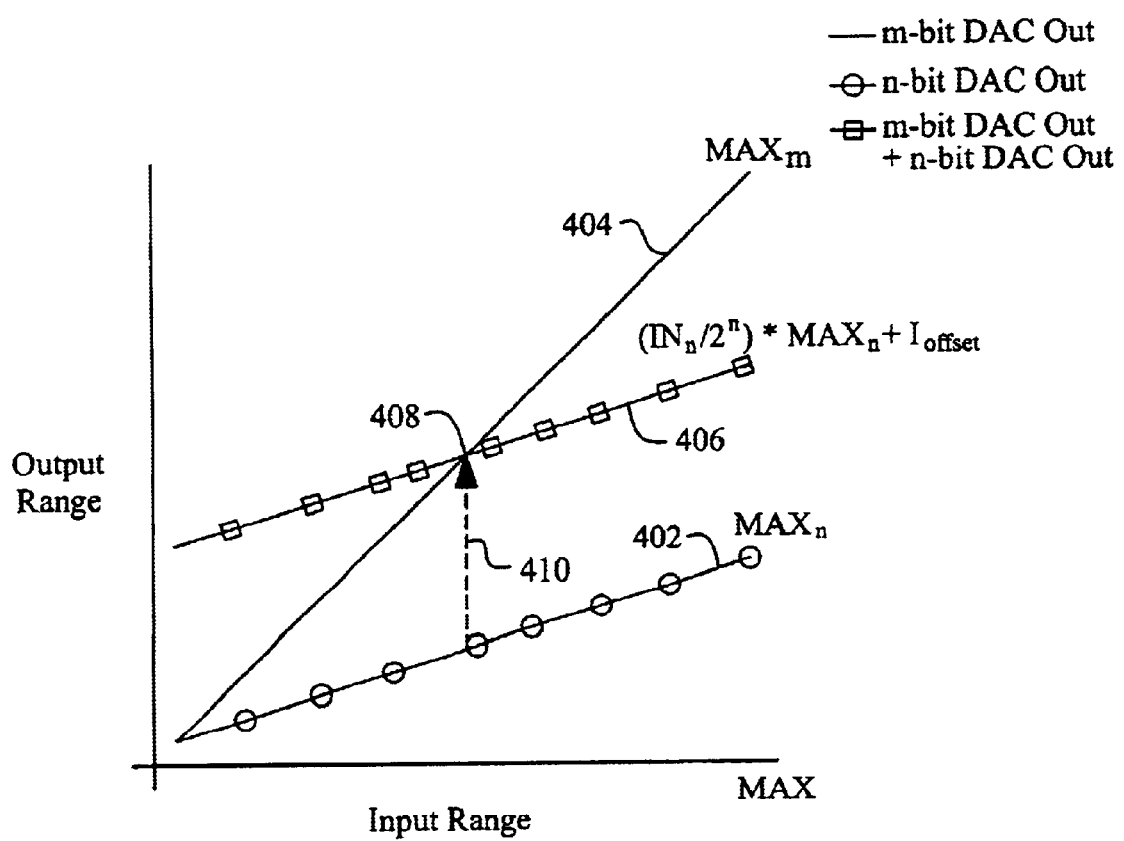
FIG. 4 illustrates various transfer functions of the D/A converter shown in FIG. 3.

FIG. 4 illustrates exemplary transfer characteristics of the converter 300 shown in FIG. 3. A first transfer characteristic 402 shows the output current of the driver 108 (i.e., the second current) as the first control inputs 104 to the DAC 102 are varied from 1 to $2^n$ for a given value of the second control inputs 110 (e.g., X=8). A second transfer characteristic 404 shows the output current of the offset control circuitry 308 as the third control inputs 304 to the second DAC 302 are varied from 1 to $2^n$. Note that in this exemplary embodiment, the output current of the offset control circuitry 308 is substantially equal to the third current generated by second DAC 302, as the current-producing capacity of the current-mirror device 314 and output device 316 of the offset control circuitry 308 are assumed to be substantially equal to one another.

A third transfer characteristic 406 shows a combined current at the output pad 312 of the converter for a given value of the third control inputs 304 when the offset control input 310 is active. For example, given an n-bit current-mode DAC 102 with a maximum output of $MAX_n$ amps, and an m-bit current-mode DAC 302 with a maximum output of $MAX_m$ amps, the combined current at the output pad 312 can be written as:

$$(IN_n/2^n)*(IN_x/X)MAX_n + I_{offset}$$

where:

$IN_x$ is in the set of integers ranging from 1 to X;

$IN_n$ is in the set of integers ranging from 1 to $2^n$; and $I_{offset} = (IN_m/2^m)*MAX_m$, where $IN_n$ is in the set of integers ranging from 1 to $2^m$.

Note that in the example, the given value of the third control inputs 304 produces an offset current $I_{offset}$ 408 (i.e., the third current) that shifts the first transfer curve 402 up by an offset amount 410 to achieve the third transfer curve 406. Thus, by varying the values of the second and third control inputs 110, 304, an output current, proportional to a digital input present on the first control inputs 104, having a variable output and offset control can be produced at the output pad 312. This current, having variable output and offset, can be used by various applications (and loads) without having to redesign or compromise the resolution of the DACs 102, 302.

Figure 5:
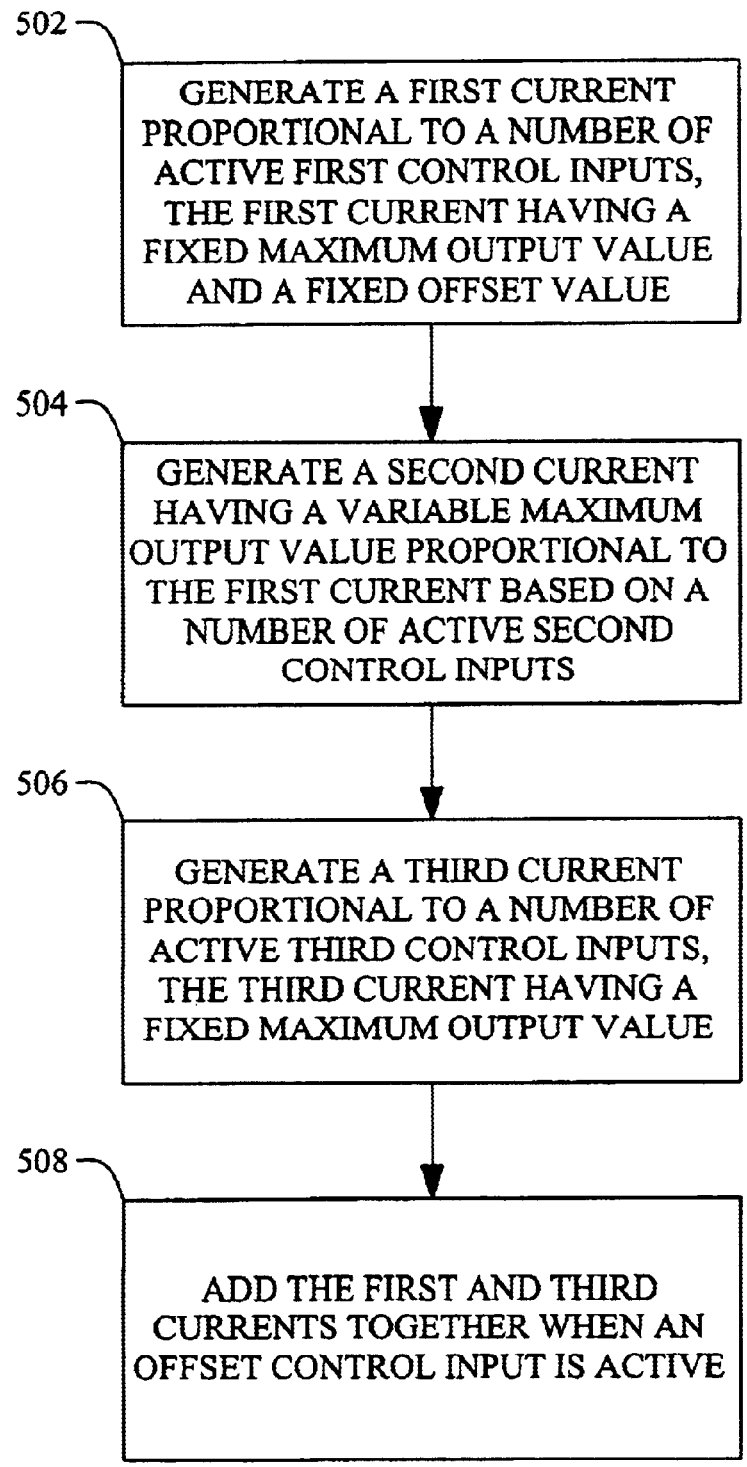
FIG. 5 illustrates a flowchart of a method for converting a digital input to a current having variable output and offset values

FIG. 5 illustrates a method for converting a digital input to a current having variable output and offset values. In step 502, a first current is generated that is proportional to a number of active first control inputs and having a fixed maximum output value and a fixed offset value. The first current can be generated via the DAC 102 described above in conjunction with the exemplary embodiment shown in FIG. 3. In step 504, a second current is generated having a variable maximum output value proportional to the first current based on a number of active second control inputs. The second current can be generated via the driver 108 described above in conjunction with the exemplary embodiment shown in FIG. 3.

In step 506, a third current proportional to a number of active third control inputs is generated having a fixed maximum output value. The third current can be generated via the DAC 302 described above in conjunction with the exemplary embodiment shown in FIG. 3. In step 508, the first and third currents are added together when an offset control input is active to form an output current proportional to a number of active first control inputs and having variable output and offset values based on the active second and third control inputs, respectively. The first and third currents can be added together via the offset control circuitry 308 described above in conjunction with the exemplary embodiment shown in FIG. 3.

It will be appreciated by those of ordinary skill in the art that the concepts and techniques described herein can be embodied in various specific forms without departing from the essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

What is claimed is:

1. A method for converting a digital input to a current having variable output and offset values, the method comprising:

generating a first current proportional to a number of active first control inputs, the first current having a fixed maximum output value and a fixed offset value;

generating a second current having a variable maximum output value proportional to the first current based on a number of active second control inputs;

generating a third current proportional to a number of active third control inputs, the third current having a fixed maximum output value; and adding the first second and third currents together when an offset control input is active to form an output current proportional to a number of active first control inputs and having variable output and of set values based on the active second and third control inputs, respectively.

2. A current-mode D/A converter having variable output control, comprising:

a D/A converter having a number of first control inputs and an output capable of generating a first current proportional to a number of active first control inputs; and a driver having an input connected to the output of the D/A converter, a number of second control inputs, and an output capable of generating a second current proportional to the first current based on a number of active second control inputs, wherein the driver comprises:

a current-mirror device having a first terminal corresponding to the input of driver;

a number of output devices in correspondence to the number of second control inputs, each output device having an output terminal connected to the output of the driver; and a selector having an input terminal connected to a second terminal of the current-mirror device, a number of control terminals each connected to a respective second control input, and a number of output terminals each connected to an input terminal of a respective output device.

3. The current-mode D/A converter of claim 2, wherein the second current is linearly proportional to the first current.

4. The current-mode D/A converter of claim 3, wherein a current-producing capacity of each of the output devices is substantially equal, and in total, is substantially equal to a current-producing capacity of the current-mirror device.

5. The current-mode D/A converter of claim 2, wherein the second current is proportional to the first current based on a binary value associated with each of the active second control inputs.

6. The current-mode D/A converter of claim 5, wherein a current-producing capacity of each of the output devices is proportional to a binary value associated with a respective second control input, and in total, is substantially equal to a current-producing capacity of the current-mirror device.

7. A current-mode D/A converter having variable output and offset control, comprising:
- a first D/A converter having a number of first control inputs and an output capable of generating a first current proportional to a number of active first control inputs;
- a driver having an input connected to the output of the first D/A converter, a number of second control inputs, and an output capable of generating a second current proportional to the first current based on a number of active second control inputs;
- a second D/A converter having a number of third control inputs and an output capable of generating a third current proportional to a number of active third control inputs; and
- offset control circuitry having an input connected to the output of the second D/A converter, an offset control input, and an output connected to the output of the driver.

8. The current-mode D/A converter of claim 7, wherein the driver comprises:
- a current-mirror device having a first terminal corresponding to the input of driver;
- a number of output devices in correspondence to the number of sand control inputs, each output device having an output terminal connected to the output of the driver; and
- a selector having an input terminal connected to a second terminal of the current-mirror device, a number of control terminals each connected to a respective second control input, and a number of output terminals each connected to an input terminal of a respective output device.

9. The current-mode D/A converter of claim 8, wherein the second current is linearly proportional to the first current.

10. The current-mode D/A converter of claim 9, wherein a current-producing capacity of each of the output devices is substantially equal, and in total, is substantially equal to a current-producing capacity of the current-mirror device.

11. The current-mode D/A converter of claim 8, wherein the second current is proportional to the first current based on a binary value associated with each of the active second control inputs.

12. The current-mode D/A converter of claim 11, wherein a current-producing capacity of each of the output devices is proportional to a binary value associated with a respective second control input, and in total, is substantially equal to a current-producing capacity of the current-mirror device.

13. The current-mode D/A converter of claim 7, wherein the offset control circuitry comprises:
- a current-mirror device having a first terminal corresponding to the input of the offset control circuitry;
- an output device having an output terminal corresponding to the output of the offset control circuitry; and
- a control device having an input terminal connected to a second terminal of the current-mirror device of the offset control circuitry, a control terminal connected to the offset control input, and an output terminal connected to an input terminal of the output device of the offset control circuitry.

14. The current-mode D/A converter of claim 13, wherein the offset control circuitry is capable of summing the second and third currents at the output of the driver when the control input is active.

15. The current-mode D/A converter of claim 13, wherein a current-producing capacity of the output device of the offset control circuitry is substantially equal to a current-producing capacity of the current-mirror device of the offset control circuitry.

* * * * *